(12) United States Patent
Miyamoto et al.

(10) Patent No.: US 9,546,309 B2
(45) Date of Patent: Jan. 17, 2017

(54) CURABLE SILICONE COMPOSITION, CURED PRODUCT THEREOF, AND OPTICAL SEMICONDUCTOR DEVICE

(71) Applicant: Dow Corning Toray Co. Ltd., Tokyo (JP)

(72) Inventors: Yusuke Miyamoto, Fuchu (JP); Makoto Yoshitake, Ichihara (JP)

(73) Assignee: DOW CORNING TORAY CO., LTD., Chiyoda-Ku, Tokyo (JP)

( * ) Notice: Subject to any disclaimer, the term of this patent is extended or adjusted under 35 U.S.C. 154(b) by 53 days.

(21) Appl. No.: 14/389,014

(22) PCT Filed: Mar. 11, 2013

(86) PCT No.: PCT/JP2013/057337
§ 371 (c)(1),
(2) Date: Sep. 29, 2014

(87) PCT Pub. No.: WO2013/146334
PCT Pub. Date: Oct. 3, 2013

(65) Prior Publication Data
US 2015/0069456 A1  Mar. 12, 2015

(30) Foreign Application Priority Data

Mar. 30, 2012 (JP) ................................ 2012-079251

(51) Int. Cl.
| | | |
|---|---|---|
| *C09J 183/04* | (2006.01) | |
| *C08L 83/04* | (2006.01) | |
| *H01L 23/29* | (2006.01) | |
| *H01L 33/56* | (2010.01) | |
| *C08G 77/04* | (2006.01) | |
| *C08G 77/12* | (2006.01) | |
| *C08K 5/5425* | (2006.01) | |
| *C08K 5/5435* | (2006.01) | |
| *C08G 77/16* | (2006.01) | |
| *C08G 77/20* | (2006.01) | |
| *H01L 23/24* | (2006.01) | |
| *H01L 23/31* | (2006.01) | |

(52) U.S. Cl.
CPC ............. *C09J 183/04* (2013.01); *C08L 83/04* (2013.01); *H01L 23/296* (2013.01); *H01L 33/56* (2013.01); *C08G 77/045* (2013.01); *C08G 77/12* (2013.01); *C08G 77/16* (2013.01); *C08G 77/20* (2013.01); *C08K 5/5425* (2013.01); *C08K 5/5435* (2013.01); *H01L 23/24* (2013.01); *H01L 23/3107* (2013.01); *H01L 2224/48091* (2013.01); *H01L 2224/73265* (2013.01)

(58) Field of Classification Search
CPC ......... C08G 77/12; C08G 77/20; C08L 83/00; C08K 5/5435
See application file for complete search history.

(56) References Cited

U.S. PATENT DOCUMENTS

| 8,317,220 | B2 | 11/2012 | Sweet et al. | |
|---|---|---|---|---|
| 2008/0003370 | A1* | 1/2008 | Sweet | C09D 183/04 427/394 |
| 2010/0276721 | A1* | 11/2010 | Yoshitake | C08K 5/5425 257/99 |
| 2011/0254047 | A1 | 10/2011 | Yoshitake et al. | |
| 2012/0071052 | A1 | 3/2012 | Sweet et al. | |

FOREIGN PATENT DOCUMENTS

| JP | 2008528788 A | 7/2008 |
|---|---|---|
| JP | 2010248384 A | 11/2010 |
| WO | WO2011093353 A2 | 8/2011 |
| WO | WO2012002561 A1 | 1/2012 |

OTHER PUBLICATIONS

English language abstract for JP2008528788 extracted from espacenet.com database on Nov. 6, 2014, 1 pages. Also see English language equivalent U.S. Pat. No. 8317220.
English language abstract and machine-assisted English language translation for JP2010248384 extracted from espacenet.com database on Nov. 6, 2014, 26 pages.
International Search Report for PCT/JP2013/057337 dated Jul. 4, 2013, 4 pages.

* cited by examiner

*Primary Examiner* — Kuo-Liang Peng
(74) *Attorney, Agent, or Firm* — Howard & Howard Attorneys PLLC

(57) ABSTRACT

A curable silicone composition comprising: (A) ($A_1$) an organopolysiloxane having at least two alkenyl groups in a molecule and free of silicon-bonded hydroxyl groups or silicon-bonded hydrogen atoms, or a mixture of said component ($A_1$) and ($A_2$) a branched chain organopolysiloxane represented by an average unit formula; (B) an organopolysiloxane having at least two silicon-bonded hydrogen atoms in a molecule; (C) a diorganodialkoxysilane represented by a general formula; (D) a straight chain organosiloxane oligomer having at least one silicon-bonded hydroxyl group in a molecule and free of silicon-bonded hydrogen atoms; and (E) a hydrosilylation catalyst, can form a cured product which exhibits excellent initial adhesive properties and transparency and exhibits excellent adhesive durability and retention of transparency under conditions of high temperature and high humidity.

9 Claims, 1 Drawing Sheet

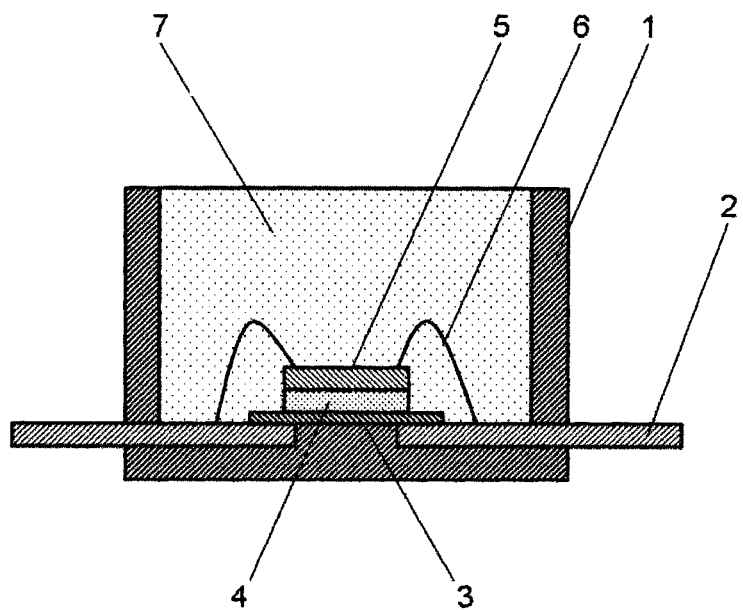

CURABLE SILICONE COMPOSITION, CURED PRODUCT THEREOF, AND OPTICAL SEMICONDUCTOR DEVICE

RELATED APPLICATIONS

This application is the National Stage of International Patent Application No. PCT/JP2013/057337, filed on Mar. 11, 2013, which claims priority to and all the advantages of Japanese Patent Application No. 2012-079251, filed on Mar. 30, 2012, the content of which is incorporated herein by reference.

TECHNICAL FIELD

The present invention relates to a curable silicone composition, a cured product thereof, and an optical semiconductor device using the cured product.

Priority is claimed on Japanese Patent Application No. 2012-079251, filed on Mar. 30, 2012, the content of which is incorporated herein by reference.

BACKGROUND ART

Hydrosilylation reaction curable silicone compositions form cured products having excellent properties such as weathering resistance and heat resistance, and are therefore used in a variety of applications. However, such compositions exhibit poor adhesive properties. As a result, curable silicone compositions containing adhesion-imparting agents have been proposed. For example, Japanese Unexamined Patent Application Publication No. 2008-528788 proposes a curable silicone composition that contains an acryloxy functional alkoxysilane or a methacryloxy functional alkoxysilane, an alkenyl functional silanol terminated organopolysiloxane and an epoxy functional alkoxysilane; and Japanese Unexamined Patent Application Publication No. 2010-248384 proposes a curable silicone composition that contains a silane coupling agent having two alkoxy groups directly bonded to a silicon atom in a molecule and at least one type of coupling agent selected from among a boron coupling agent, a titanium coupling agent, an aluminum coupling agent and a zirconium coupling agent.

The curable silicone composition proposed in Japanese Unexamined Patent Application Publication No. 2008-528788 relates to a coating composition for a synthetic fiber material, and does not indicate or suggest that it is possible to solve the problem of a cured product obtained from the composition exhibiting reduced adhesive properties and transparency over time under conditions of high temperature and high humidity by combining the specified alkoxysilane and alkenyl functional silanol terminated organopolysiloxane.

In addition, the curable silicone composition proposed in Japanese Unexamined Patent Application Publication No. 2010-248384 has the problem of a cured product obtained from the composition exhibiting reduced adhesive properties and transparency over time under conditions of high temperature and high humidity. As a result, using the present composition as a sealing agent or adhesive for an optical semiconductor element leads to the problem of significantly reduced optical semiconductor device reliability under conditions of high temperature and high humidity.

An object of the present invention is to provide a curable silicone composition that forms a cured product which exhibits excellent initial adhesive properties and transparency and exhibits excellent adhesive durability and retention of transparency under conditions of high temperature and high humidity. A further object of the present invention is to provide this type of cured product. A further object of the present invention is to provide an optical semiconductor device having excellent reliability that uses this type of cured product.

DISCLOSURE OF INVENTION

The curable silicone composition of the present invention comprises:
(A) 100 parts by mass of ($A_1$) an organopolysiloxane having at least two alkenyl groups in a molecule, and free of silicon-bonded hydroxyl groups and silicon-bonded hydrogen atoms, or a mixture of said component ($A_1$) and ($A_2$) a branched chain organopolysiloxane represented by the following average unit formula:

$$(R^1{}_2R^2SiO_{1/2})_a(R^1{}_3SiO_{1/2})_b(SiO_{4/2})_c(HO_{1/2})_d$$

wherein $R^1$ are the same or different alkyl groups having from 1 to 10 carbons; $R^2$ is an alkenyl group; and "a", "b", "c" and "d" are all positive numbers that satisfy the following conditions: a+b+c=1; a/(a+b)=0.15 to 0.35; c/(a+b+c)=0.53 to 0.62; and d/(a+b+c)=0.005 to 0.03;
(B) an organopolysiloxane having at least two silicon-bonded hydrogen atoms in a molecule, in an amount that provides from 0.1 to 10 moles of silicon-bonded hydrogen atoms in this component per 1 mole of the alkenyl groups in component (A);
(C) from 0.01 to 10 parts by mass of a diorganodialkoxysilane represented by the following general formula:

$$R^3R^4Si(OR^5)_2$$

wherein $R^3$ is a glycidoxyalkyl group, an epoxycyclohexylalkyl group, an epoxyalkyl group, an acryloxyalkyl group, or a methacryloxyalkyl group; $R^4$ is an alkyl group having from 1 to 6 carbons; and $R^5$ is an alkyl group having from 1 to 4 carbons;
(D) from 0.01 to 10 parts by mass of a straight chain organosiloxane oligomer having at least one silicon-bonded hydroxyl group in a molecule and free of silicon-bonded hydrogen atoms; and
(E) a catalytic amount of a hydrosilylation catalyst.

Moreover, the cured product of the present invention is obtained by curing the above-mentioned composition.

Furthermore, the optical semiconductor device of the present invention comprises: an optical semiconductor element; and a cured product which is obtained by curing the above-mentioned curable silicone composition and which seals or bonds said element.

EFFECTS OF INVENTION

The curable silicone composition of the present invention forms a cured product which exhibits excellent initial adhesive properties and transparency and exhibits excellent adhesive durability and retention of transparency under conditions of high temperature and high humidity. In addition, the cured product of the present invention exhibits excellent initial adhesive properties and transparency and exhibits excellent adhesive durability and retention of transparency under conditions of high temperature and high humidity. Furthermore, the optical semiconductor device of the present invention exhibits excellent reliability.

BRIEF DESCRIPTION OF THE DRAWINGS

FIG. 1 is a cross-sectional view of an LED that is an example of the optical semiconductor device of the present invention.

DETAILED DESCRIPTION OF THE INVENTION

Firstly, the curable silicone composition of the present invention will be explained in detail.

Component (A) is a primary component in the present composition and is ($A_1$) an organopolysiloxane having at least two alkenyl groups in a molecule, and free of silicon-bonded hydroxyl groups and silicon-bonded hydrogen atoms, or a mixture of said component ($A_1$) and ($A_2$) a branched chain organopolysiloxane represented by the following average unit formula:

$$(R^1{}_2R^2SiO_{1/2})_a(R^1{}_3SiO_{1/2})_b(SiO_{4/2})_c(HO_{1/2})_d$$

Examples of the alkenyl groups in component ($A_1$) include vinyl, allyl, isopropenyl, butenyl, hexenyl and cyclohexenyl groups, with vinyl groups being preferred. Examples of the silicon-bonded organic groups other than alkenyl groups in component ($A_1$) include alkyl groups such as methyl, ethyl, propyl, butyl, pentyl, hexyl, cyclopentyl or cyclohexyl groups; aryl groups such as phenyl, tolyl or xylyl groups; aralkyl groups such as benzyl or phenethyl groups; or halogenated alkyl groups such as 3-chloropropyl or 3,3,3-trifluoropropyl groups, with methyl or phenyl groups being preferred. The viscosity of component ($A_1$) at 25° C. is not limited, but is preferably from 10 to 10,000,000 mPa·s, and more preferably from 50 to 1,000,000 mPa·s. The molecular structure of component ($A_1$) is not limited, and may be a straight chain, a partially branched straight chain, or a branched chain, with a straight chain being preferred.

Examples of this type of component ($A_1$) include a dimethylpolysiloxane capped at both molecular terminals with dimethylvinylsiloxy groups, a copolymer of dimethylsiloxane and methylvinylsiloxane capped at both molecular terminals with dimethylvinylsiloxy groups, a copolymer of dimethylsiloxane and methylphenylsiloxane capped at both molecular terminals with dimethylvinylsiloxy groups, a methylvinylpolysiloxane capped at both molecular terminals with trimethylsiloxy groups, a copolymer of dimethylsiloxane and methylvinylsiloxane capped at both molecular terminals with trimethylsiloxy groups, or a mixture of two or more of these.

Component ($A_2$) is an optional component used to impart the cured product of the present composition with appropriate hardness and mechanical strength, and is represented by the following average unit formula:

$$(R^1{}_2R^2SiO_{1/2})_a(R^1{}_3SiO_{1/2})_b(SiO_{4/2})_c(HO_{1/2})_d$$

In the formula, $R^1$ are the same or different alkyl groups having from 1 to 10 carbons, specific examples of which include methyl, ethyl, propyl, butyl, pentyl, hexyl, cyclopentyl and cyclohexyl groups, with methyl groups being preferred. In the formula, $R^2$ is an alkenyl group, examples of which include vinyl, allyl, isopropenyl, butenyl, hexenyl and cyclohexenyl groups, with vinyl groups being preferred. In the formula, "a", "b", "c" and "d" are all positive numbers that satisfy the following conditions: a+b+c=1; a/(a+b)=0.15 to 0.35; c/(a+b+c)=0.53 to 0.62; and d/(a+b+c)=0.005 to 0.03. In order to impart the present composition with satisfactory curability, it is preferable for a/(a+b) to be number from 0.2 to 0.3. In order to impart the cured product of the present composition with satisfactory hardness and mechanical strength, it is preferable for c/(a+b+c) to be number from 0.55 to 0.60. In order to impart the cured product of the present composition with satisfactory adhesive properties and mechanical strength, it is preferable for d/(a+b+c) to be number from 0.01 to 0.025.

Component ($A_2$) is an optional component, but in order for component ($A_2$) to impart the cured product of the present composition with satisfactory hardness and mechanical strength, component (A) is preferably a mixture of component ($A_1$) and component ($A_2$). In order for the present composition to exhibit good handlability, a content of component ($A_2$) in component (A) is preferably 60 mass % or less, and more preferably from 15 to 60 mass %.

Component (B) is used to cure the present composition, and is an organopolysiloxane having at least two silicon-bonded hydrogen atoms in a molecule. Examples of the silicon-bonded organic group in component (B) include alkyl groups such as methyl, ethyl, propyl, butyl, pentyl, hexyl, cyclopentyl or cyclohexyl groups; aryl groups such as phenyl, tolyl or xylyl groups; aralkyl groups such as benzyl or phenethyl groups; or halogenated alkyl groups such as 3-chloropropyl or 3,3,3-trifluoropropyl groups, with methyl or phenyl groups being preferred. The viscosity of component (B) at 25° C. is not limited, but is preferably from 1 to 10,000 mPa·s, and more preferably from 5 to 1,000 mPa·s. The molecular structure of component (B) is not limited, and may be a straight chain, a partially branched straight chain, cyclic, or a branched chain, with a straight chain being preferred.

Examples of this type of component (B) include a dimethylpolysiloxane capped at both molecular terminals with dimethylhydrogensiloxy groups, a copolymer of dimethylsiloxane and methylhydrogensiloxane capped at both molecular terminals with dimethylhydrogensiloxy groups, a methylhydrogenpolysiloxane capped at both molecular terminals with trimethylsiloxy groups, a copolymer of dimethylsiloxane and methylhydrogensiloxane capped at both molecular terminals with trimethylsiloxy groups, an organopolysiloxane comprising: $SiO_{4/2}$ units and $(CH_3)_2HSiO_{1/2}$ units, an organopolysiloxane comprising: $SiO_{4/2}$ units, $(CH_3)_2HSiO_{1/2}$ units and $(CH_3)_3SiO_{1/2}$ units, and mixtures of two or more of these.

A content of component (B) is an amount that provides from 0.1 to 10 moles, and preferably from 0.5 to 5 moles of silicon-bonded hydrogen atoms in this component per 1 mole of the alkenyl groups in component (A). This is because the curability of the present composition is improved if the content of component (B) is no lower than the lower limit of the above-mentioned range, and the mechanical properties and heat resistance of a cured product obtained by curing the present composition are improved if the content of component (B) is no higher than the upper limit of the above-mentioned range.

Component (C) is used to improve the adhesive properties of the present composition, and is a diorganodialkoxysilane represented by the following general formula:

$$R^3R^4Si(OR^5)_2$$

In this formula, $R^3$ is a glycidoxyalkyl group such as a 3-glycidoxypropyl group or a 4-glycidoxybutyl group; an epoxycyclohexylalkyl group such as a 2-(3,4-epoxycyclohexyl) ethyl group or a 3-(3,4-epoxycyclohexyl)propyl group; an epoxyalkyl group such as a 5,6-epoxyhexyl group or a 9,10-epoxydecyl group; an acryloxyalkyl group such as a 3-acryloxypropyl group or a 4-acryloxybutyl group; or a methacryloxyalkyl group such as a 3-methacryloxypropyl group or a 4-methacryloxybutyl group. In this formula, $R^4$ is an alkyl group having from 1 to 6 carbons, examples of which include methyl, ethyl, propyl, butyl, pentyl and hexyl groups, with methyl groups being preferred. In this formula, $R^5$ is an alkyl group having from 1 to 4 carbons, examples of which include methyl, ethyl, propyl and butyl groups, with methyl or ethyl groups being preferred.

Examples of this type of component (C) include 3-glycidoxypropylmethyldimethoxysilane, 3-glycidoxypropylmethyldiethoxysilane, 2-(3,4-epoxycyclohexyl)ethylmethyldimethoxysilane, 2-(3,4-epoxycyclohexyl)ethylmethyldiethoxysilane, 5,6-epoxyhexylmethyldimethoxysilane, 5,6-epoxyhexylmethyldiethoxysilane, 3-acryloxypropylmethyldimethoxysilane, 3-acryloxypropylmethyldiethoxysilane, 3-methacryloxypropylmethyldimethoxysilane and 3-methacryloxypropylmethyldiethoxysilane.

A content of component (C) is from 0.01 to 10 parts by mass, and preferably from 0.1 to 10 parts by mass, per 100 parts by mass of component (A). This is because the adhesive properties of a cured product obtained by curing the present composition are improved if the content of component (C) is no lower than the lower limit of the above-mentioned range, and the storage stability of the present composition is improved if the content of component (C) is no higher than the upper limit of the above-mentioned range.

Component (D) is a component that contributes to maintaining the transparency, and adhesive properties of a cured product obtained by curing the present composition, and is a straight chain organosiloxane oligomer having at least one silicon-bonded hydroxyl group (that is, a silanol group) in a molecule and free of silicon-bonded hydrogen atoms. Examples of the silicon-bonded organic group in component (D) include alkyl groups such as methyl, ethyl, propyl, butyl, pentyl, hexyl, cyclopentyl or cyclohexyl groups; alkenyl groups such as vinyl, allyl, isopropenyl, butenyl, hexenyl or cyclohexenyl groups; aryl groups such as phenyl, tolyl or xylyl groups; aralkyl groups such as benzyl or phenethyl groups; or halogenated alkyl groups such as 3-chloropropyl or 3,3,3-trifluoropropyl groups, with methyl or vinyl groups being preferred. Moreover, component (D) preferably has at least one alkenyl group in a molecule. The viscosity of component (D) at 25° C. is not limited, but is preferably from 1 to 100 mPa·s, and more preferably from 1 to 50 mPa·s.

Examples of this type of component (D) include a copolymer oligomer of dimethylsiloxane and methylvinylsiloxane capped at both molecular terminals with silanol groups, a methylvinylsiloxane oligomer capped at both molecular terminals with silanol groups and a dimethylsiloxane oligomer capped at both molecular terminals with silanol groups.

A content of component (D) is from 0.01 to 10 parts by mass, and preferably from 0.1 to 10 parts by mass, per 100 parts by mass of component (A). This is because the good transparency of a cured product obtained by curing the present composition can be maintained if the content of component (D) is no lower than the lower limit of the above-mentioned range, and the good adhesive properties of a cured product obtained by curing the present composition can be maintained if the content of component (D) is no higher than the upper limit of the above-mentioned range.

Component (E) is a hydrosilylation catalyst used to accelerate curing of the present composition. Examples of this type of component (E) include a platinum-based catalyst, a rhodium-based catalyst and a palladium-based catalyst, with a platinum-based catalyst being preferred due to being able to significantly accelerate curing of the present composition. Examples of the platinum-based catalyst include a platinum fine powder, chloroplatinic acid, an alcohol solution of chloroplatinic acid, a platinum-alkenylsiloxane complex, a platinum-olefin complex and a platinum-carbonyl complex, with a platinum-alkenylsiloxane complex being particularly preferred. Examples of the alkenylsiloxane include 1,3-divinyl-1,1,3,3-tetramethyldisiloxane and 1,3,5,7-tetramethyl-1,3,5,7-tetravinylcyclotetrasiloxane. In order for the platinum-alkenylsiloxane complex to exhibit good stability, the use of 1,3-divinyl-1,1,3,3-tetramethyldisiloxane is particularly preferred. In addition, in order to be able to improve the stability of the platinum-alkenylsiloxane complex, it is preferable to add an alkenylsiloxane such as 1,3-divinyl-1,1,3,3-tetramethyldisiloxane, 1,3-diallyl-1,1,3,3-tetramethyldisiloxane or 1,3,5,7-tetramethyl-1,3,5,7-tetravinylcyclotetrasiloxane or an organosiloxane oligomer such as a dimethylsiloxane oligomer, and especially an alkenylsiloxane, to the complex.

A content of the component (E) is a catalytic amount and is not particularly limited as long as the amount used can accelerate curing of the present composition, but is preferably such an amount that the amount of metal atoms in this component is from 0.01 to 500 ppm, and more preferably from 0.01 to 50 ppm, in terms of mass units, relative to the present composition. This is because it is possible to satisfactorily cure the present composition if the content of component (E) is no lower than the lower limit of the above-mentioned range, and the transparency of a cured product obtained by curing the present composition are improved if the content of component (E) is no higher than the upper limit of the above-mentioned range.

A reaction inhibitor, for example, an alkyne alcohol such as 2-methyl-3-butyn-2-ol, 3,5-dimethyl-1-hexyn-3-ol or 2-phenyl-3-butyn-2-ol; an ene-yne compound such as 3-methyl-3-penten-1-yne or 3,5-dimethyl-3-hexen-1-yne; or 1,3,5,7-tetramethyl-1,3,5,7-tetravinylcyclotetrasiloxane, 1,3,5,7-tetramethyl-1,3,5,7-tetrahexenylcyclotetrasiloxane or a benzotriazole may be incorporated as an optional component in the present composition. A content of the reaction inhibitor is not limited, but is preferably from 0.0001 to 5 parts by mass per 100 parts by mass of component (A).

In addition, an organic titanium compound such as titanium isopropoxide, titanium isobutoxide, titanium di-isopropoxide bis(2,4-pentanedionate), titanium di-isopropoxide bis(tetramethylheptanedionate) or titanium di-isopropoxide bis(ethylacetoacetate); an organic aluminum compound such as aluminum acetylacetonate, aluminum di-s-butoxide ethylacetoacetate or aluminum di-isopropoxide ethylacetoacetate; an organic zirconium compound such as zirconium n-butoxide, zirconium di-n-butoxide bis(2,4-pentanedionate) or zirconium 2,4-pentanedionate; or an organometallic compound such as iron 2,4-pentanedionate, iron tetramethyl heptanedionate or other organoiron compounds may be incorporated in the present composition in order to improve the adhesive properties thereof. A content of the organometallic compound is preferably from 0.0001 to 1 parts by mass per 100 parts by mass of component (A).

An inorganic filler such as silica, glass, alumina or zinc oxide; an organic resin fine powder of a polymethacrylate resin and the like; a heat-resistant agent, a dye, a pigment, a flame retardant, a solvent and the like may be incorporated as optional components in the present composition at levels that do not impair the objective of the present invention.

The present composition is such that curing occurs either at room temperature or under heating, but it is preferable to heat the composition in order to achieve rapid curing. The heating temperature is preferably from 50 to 200° C.

The cured product of the present invention is obtained by curing the above-mentioned composition, and the hardness thereof is not limited, but it is preferable for the type A durometer hardness specified in JIS K 6253 to be from 20 to 99, and more preferably from 30 to 95. This is because the surface tack of the cured product is low and it is possible to suppress adhesion between cured products and attachment of dirt if the hardness of the cured product is no lower than the lower limit of the above-mentioned range, and cracks hardly occur in the cured product if the hardness of the cured product is no higher than the upper limit of the above-mentioned range.

The cured product exhibits excellent retention of transparency under conditions of high temperature and high humidity, but improves the reliability of an optical semiconductor device in cases where the above-mentioned composition is used as a sealing agent or adhesive for an optical semiconductor element, and the cured product preferably has a rate of change in light transmittance [(T2/T1)×100] of 90% or higher, and more preferably 95% or higher, where T1 (%) is the initial light transmittance of the cured product (light path length: 1.0 mm) at 25° C. and a wavelength of 450 nm and T2 (%) is the light transmittance of the aforementioned cured product after being exposed for 1,000 hours at a temperature of 85° C. and a relative humidity of 85%.

In addition, the cured product exhibits excellent adhesive durability under conditions of high temperature and high humidity, but improves the reliability of an optical semiconductor device in cases where the above-mentioned composition is used as a sealing agent or adhesive for an optical semiconductor element, and the cured product preferably has a rate of change in adhesive strength [(S2/S1)×100] of 80% or higher, and more preferably 90% or higher, where S1 (%) is the initial adhesive strength of the cured product to a polyphthalamide (PPA) sheet at 25° C. and S2 (%) is the adhesive strength after the cured product is exposed for 1,000 hours at a temperature of 85° C. and a relative humidity of 85%.

The optical semiconductor device of the present invention will now be explained in detail.

The optical semiconductor device of the present invention comprises an optical semiconductor element and a cured product which is obtained by curing the above-mentioned curable silicone composition and which seals or bonds said element. Examples of the optical semiconductor element include a light emitting diode (LED), a semiconductor laser, a photodiode, a phototransistor, a solid state imaging device and a photoemitter and photoreceptor for a photocoupler, with a light emitting diode (LED) being preferred.

In a light emitting diode (LED) device, because a light emitting diode (LED) emits light vertically and horizontally, it is not desirable for constituent components of the optical semiconductor device to absorb light, and materials having high light transmittance or high reflectivity are selected. This also applies to the substrate on which the optical semiconductor element is mounted. Examples of the substrate include an electrically conductive metal such as silver, gold or copper; a non-conductive metal such as aluminum or nickel; a white pigment-containing thermoplastic resin such as PPA or LCP; a white pigment-containing thermosetting resin such as an epoxy resin, a BT resin, a polyimide resin or a silicone resin; or a ceramic such as alumina or alumina nitride. The optical semiconductor device of the present invention uses the above-mentioned composition, and therefore exhibits good adhesive properties between the optical semiconductor element and the substrate and can improve the reliability of the optical semiconductor device.

The optical semiconductor device of the present invention will now be explained by means of FIG. 1. FIG. 1 is a cross-sectional view of a stand-alone surface-mounted light emitting diode (LED) device that is a typical example of an optical semiconductor device. The light emitting diode (LED) device illustrated in FIG. 1 is such that a light emitting diode (LED) chip (5) is die bonded on a die pad (3) inside a polyphthalamide (PPA) resin housing (1) by means of an adhesive material (4). The light emitting diode (LED) chip (5) and an inner lead (2) are wire bonded by means of bonding wires (6) and sealed to the inner walls of said housing by means of a sealing material (7). In the optical semiconductor device, the composition that forms the sealing material (7) is the above-mentioned composition.

EXAMPLES

The curable silicone composition of the present invention, a cured product thereof and an optical semiconductor device will now be explained using examples. Moreover, the physical property values are values measured at 25° C., and the properties of the cured product were measured as follows.

[Hardness of Cured Product]

A cured product was prepared by heating the curable silicone composition for 1 hour at 150° C. The hardness of the cured product was measured using a type A durometer specified in JIS K 6253.

The cured product was then exposed for 1,000 hours at a temperature of 85° C. and a relative humidity of 85%. The hardness of the cured product after treatment under conditions of high temperature and high humidity was measured in the same way as described above.

[Light Transmittance of Cured Product]

A cured product having a light path length of 1.0 mm was prepared by heating the curable silicone composition for 1 hour at 150° C. The light transmittance of the cured product was measured at a wavelength of 450 nm.

The cured product was then exposed for 1,000 hours at a temperature of 85° C. and a relative humidity of 85%. The light transmittance of the cured product after treatment under conditions of high temperature and high humidity was measured in the same way as described above.

[Adhesive Strength of Cured Product]

A polytetrafluoroethylene resin spacer (width: 10 mm, length: 20 mm, thickness: 1 mm) was interposed between two polyphthalamide (PPA) resin sheets (width: 25 mm, length: 50 mm, thickness: 1 mm), this gap was filled with the curable silicone composition, the sheets were clamped with a clip, and the aforementioned composition was then cured by heating for 1 hour in an internal air circulation type oven at 150° C. After cooling to room temperature, and the adhesive strength of the cured product was measured by pulling a sample obtained by removing the clip and spacer in horizontally opposite directions using a tensile tester.

In addition, the above-mentioned sample was then exposed for 1,000 hours at a temperature of 85° C. and a relative humidity of 85%. The adhesive strength of the cured product was measured for the sample after treatment under conditions of high temperature and high humidity in the same way as described above.

Practical Examples 1 to 4 and Comparative Examples 1 to 5

Curable silicone compositions were prepared by homogeneously mixing the following components at the compositions shown in table 1. Wherein, Vi denotes a vinyl group and Me denotes a methyl group. In the table, SiH/Vi denotes the total number of moles of silicon-bonded hydrogen atoms in components (B-1) to (B-2) per a total of 1 mole of vinyl groups in components (A-1) to (A-4) in the curable silicone composition, the rate of change in light transmittance means the change in light transmittance of the cured product after treatment under conditions of high temperature and high humidity relative to the initial light transmittance, and the rate of change in adhesive strength means the change in adhesive strength of the cured product after treatment under conditions of high temperature and high humidity relative to the initial adhesive strength.

Component (A-1): Dimethylpolysiloxane capped at both molecular terminals with dimethylvinylsiloxy groups, which has a viscosity of 360 mPa·s (vinyl group content=0.44 mass %)

Component (A-2): Dimethylpolysiloxane capped at both molecular terminals with dimethylvinylsiloxy groups, which has a viscosity of 11,000 mPa·s (vinyl group content=0.14 mass %)

Component (A-3): Organopolysiloxane resin which is a white solid at 25° C., is soluble in toluene and is represented by the following average unit formula:

$$(ViMe_2SiO_{1/2})_{0.13}(Me_3SiO_{1/2})_{0.45}(SiO_{4/2})_{0.42}(HO_{1/2})_{0.01}$$

(vinyl group content=3.4 mass %)

Component (A-4): Organopolysiloxane which is a white solid at 25° C., is soluble in toluene and is represented by the following average unit formula:

$$(ViMe_2SiO_{1/2})_{0.15}(Me_3SiO_{1/2})_{0.38}(SiO_{4/2})_{0.47}(HO_{1/2})_{0.01}$$

(vinyl group content=4.2 mass %)

Component (B-1): Copolymer of dimethylsiloxane and methylhydrogensiloxane capped at both molecular terminals with trimethylsiloxy groups, which has a viscosity of 5 mPa·s (silicon-bonded hydrogen atom content=1.4 mass %)

Component (B-2): Polymethylhydrogensiloxane capped at both molecular terminals with trimethylsiloxy groups, which has a viscosity of 20 mPa·s (silicon-bonded hydrogen atom content=1.57 mass %)

Component (C-1): 3-glycidoxypropyltrimethoxysilane

Component (C-2): 3-glycidoxypropylmethyldimethoxysilane

Component (C-3): 3-glycidoxypropylmethyldiethoxysilane

Component (C-4): 3-acryloxypropylmethyldimethoxysilane

Component (D-1): Copolymer oligomer of dimethylsiloxane and methylvinylsiloxane capped at both molecular terminals with silicon-bonded hydrogen atoms, which has a viscosity of 40 mPa·s Component (E-1): 1,3-divinyltetramethyl disiloxane solution of 1,3-divinyltetramethyl disiloxane platinum complex (platinum metal content=4,000 ppm)

Component (F-1): 3,5-dimethyl-1-octyn-3-ol

TABLE 1

|  |  | | Present invention | | | |
|---|---|---|---|---|---|---|
|  |  | | Practical Example 1 | Practical Example 2 | Practical Example 3 | Practical Example 4 |
| Curable silicone composition (parts by mass) | Component (A-1) | | 35 | 33 | 0 | 95 |
| | Component (A-2) | | 30 | 30 | 39 | 0 |
| | Component (A-3) | | 30 | 0 | 55 | 0 |
| | Component (A-4) | | 0 | 30 | 0 | 0 |
| | Component (B-1) | | 3 | 0 | 4 | 0 |
| | Component (B-2) | | 0 | 5 | 0 | 3 |
| | Component (C-1) | | 0 | 0 | 0 | 0 |
| | Component (C-2) | | 1 | 0 | 0 | 1 |
| | Component (C-3) | | 0 | 1 | 0 | 0 |
| | Component (C-4) | | 0 | 0 | 1 | 0 |
| | Component (D-1) | | 1 | 1 | 1 | 1 |
| | Component (E-1) | | 0.1 | 0.1 | 0.1 | 0.1 |
| | Component (F-1) | | 0.1 | 0.1 | 0.1 | 0.1 |
| SiH/Vi | | | 0.9 | 1.5 | 0.8 | 3.0 |
| Cured product | Initial | Type A durometer hardness | 50 | 70 | 80 | 31 |
| | | Light transmittance (%) | 99 | 99 | 99 | 99 |
| | | Adhesive strength (MPa) | 5.3 | 6.5 | 6.3 | 0.6 |
| | After treatment | Type A durometer hardness | 52 | 70 | 80 | 31 |
| | | Light transmittance (%) | 98 | 98 | 98 | 98 |
| | | Adhesive strength (MPa) | 5.0 | 6.0 | 5.8 | 0.7 |
| Change in light transmittance (%) | | | 99.0 | 99.0 | 99.0 | 99.0 |
| Change in adhesive strength (%) | | | 94.3 | 92.3 | 92.1 | 117 |

TABLE 1-continued

|  |  | | Comparative Examples | | |
|---|---|---|---|---|---|
|  |  | | Comparative Example 1 | Comparative Example 2 | Comparative Example 3 |
| Curable silicone composition (parts by mass) | Component (A-1) | | 78 | 79 | 36 |
| | Component (A-2) | | 0 | 0 | 30 |
| | Component (A-3) | | 0 | 0 | 30 |
| | Component (A-4) | | 15 | 15 | 0 |
| | Component (B-1) | | 0 | 0 | 3 |
| | Component (B-2) | | 5 | 5 | 0 |
| | Component (C-1) | | 1 | 1 | 0 |
| | Component (C-2) | | 0 | 0 | 1 |
| | Component (C-3) | | 0 | 0 | 0 |
| | Component (C-4) | | 0 | 0 | 0 |
| | Component (D-1) | | 1 | 0 | 0 |
| | Component (E-1) | | 0.1 | 0.1 | 0.1 |
| | Component (F-1) | | 0.1 | 0.1 | 0.1 |
| SiH/Vi | | | 2.2 | 2.2 | 0.9 |
| Cured product | Initial | Type A durometer hardness | 35 | 35 | 50 |
| | | Light transmittance (%) | 99 | 99 | 99 |
| | | Adhesive strength (MPa) | 4.2 | 4.0 | 5.1 |
| | After treatment | Type A durometer hardness | 36 | 36 | 51 |
| | | Light transmittance (%) | 88 | 80 | 87 |
| | | Adhesive strength (MPa) | 4.3 | 3.1 | 4.0 |
| Change in light transmittance (%) | | | 88.9 | 80.8 | 87.9 |
| Change in adhesive strength (%) | | | 102 | 77.5 | 78.4 |

|  |  | | Comparative Examples | |
|---|---|---|---|---|
|  |  | | Comparative Example 4 | Comparative Example 5 |
| Curable silicone composition (parts by mass) | Component (A-1) | | 34 | 0 |
| | Component (A-2) | | 30 | 40 |
| | Component (A-3) | | 0 | 55 |
| | Component (A-4) | | 30 | 0 |
| | Component (B-1) | | 0 | 4 |
| | Component (B-2) | | 5 | 0 |
| | Component (C-1) | | 0 | 0 |
| | Component (C-2) | | 0 | 0 |
| | Component (C-3) | | 0 | 0 |
| | Component (C-4) | | 1 | 0 |
| | Component (D-1) | | 0 | 1 |
| | Component (E-1) | | 0.1 | 0.1 |
| | Component (F-1) | | 0.1 | 0.1 |
| SiH/Vi | | | 1.5 | 0.8 |
| Cured product | Initial | Type A durometer hardness | 70 | 80 |
| | | Light transmittance (%) | 99 | 99 |
| | | Adhesive strength (MPa) | 6.4 | 3.2 |
| | After treatment | Type A durometer hardness | 70 | 80 |
| | | Light transmittance (%) | 87 | 98 |
| | | Adhesive strength (MPa) | 5.0 | 0.7 |
| Change in light transmittance (%) | | | 87.9 | 99.0 |
| Change in adhesive strength (%) | | | 78.1 | 21.9 |

INDUSTRIAL APPLICABILITY

The curable silicone composition of the present invention exhibits excellent initial adhesive properties and adhesive durability to a metal such as steel, stainless steel, aluminum, copper, silver, titanium or a titanium alloy; a semiconductor element such as a silicon semiconductor, a gallium-phosphorus-based semiconductor, a gallium-arsenic-based semiconductor or a gallium nitride-based semiconductor; a ceramic material, a glass, a thermosetting resin, a thermoplastic resin having a polar group, and the like, and particularly excellent adhesive durability when subjected to heating and cooling cycles, and is therefore useful as a sealing agent or adhesive for an optical semiconductor element such as a light emitting diode (LED), a semiconductor laser, a photodiode, a phototransistor, a solid state imaging device or a photoemitter and photoreceptor for a photocoupler. In addition, the optical semiconductor device of the present invention is useful as an optical semiconductor device such as an optical device, optical equipment, lighting equipment or a lighting device.

DESCRIPTION OF SYMBOLS

1 Polyphthalamide (PPA) resin housing
2 Inner lead
3 Die pad
4 Adhesive material
5 Light emitting diode (LED) chip
6 Bonding wire
7 Sealing material

The invention claimed is:

1. A curable silicone composition comprising:
    (A) 100 parts by mass of a mixture of ($A_1$) an organopolysiloxane having at least two alkenyl groups in a molecule, and free of silicon-bonded hydroxyl groups and silicon-bonded hydrogen atoms and ($A_2$) a branched chain organopolysiloxane represented by the following average unit formula:

$(R^1{}_2R^2SiO_{1/2})_a(R^1{}_3SiO_{1/2})_b(SiO_{4/2})_c(HO_{1/2})_d$ wherein $R^1$ are the same or different alkyl groups having from 1 to 10 carbons; $R^2$ is an alkenyl group; and "a", "b", "c" and "d" are all positive numbers that satisfy the following conditions: a+b+c=1; a/(a+b)=0.15 to 0.35; c/(a+b+c)=0.53 to 0.62; and d/(a+b+c)=0.005 to 0.03;
    (B) an organopolysiloxane having at least two silicon-bonded hydrogen atoms in a molecule, in an amount that provides from 0.1 to 10 moles of silicon-bonded hydrogen atoms in this component per 1 mole of the alkenyl groups in component (A);
    (C) from 0.01 to 10 parts by mass of a diorganodialkoxysilane represented by the following general formula:

$R^3R^4Si(OR^5)_2$ wherein $R^3$ is a glycidoxyalkyl group, an epoxycyclohexylalkyl group, an epoxyalkyl group, an acryloxyalkyl group, or a methacryloxyalkyl group; $R^4$ is an alkyl group having from 1 to 6 carbons; and $R^5$ is an alkyl group having from 1 to 4 carbons;
    (D) from 0.01 to 10 parts by mass of a straight chain organosiloxane oligomer having at least one silicon-bonded hydroxyl group in a molecule and free of silicon-bonded hydrogen atoms; and
    (E) a catalytic amount of a hydrosilylation catalyst.

2. The curable silicone composition according to claim 1, wherein a content of component ($A_2$) in component (A) is 60 mass % or less.

3. The curable silicone composition according to claim 1, which is a sealing agent or adhesive for an optical semiconductor element.

4. A cured product obtained by curing the curable silicone composition of claim 1.

5. An optical semiconductor device comprising: an optical semiconductor element; and a cured product of the curable silicone composition of claim 1, which seals or bonds the optical semiconductor element.

6. The optical semiconductor device according to claim 5, wherein the optical semiconductor element is a light emitting diode.

7. The curable silicone composition according to claim 1, wherein component ($A_1$) is a dimethylpolysiloxane capped at both molecular terminals with dimethylvinylsiloxy groups.

8. The curable silicone composition according to claim 2, wherein the following conditions are satisfied: a/(a+b)=0.2 to 0.3; c/(a+b+c)=0.55 to 0.60; and d/(a+b+c)=0.01 to 0.025.

9. The curable silicone composition according to claim 1, wherein the following conditions are satisfied: a/(a+b)=0.2 to 0.3; c/(a+b+c)=0.55 to 0.60; and d/(a+b+c)=0.01 to 0.025.

* * * * *